United States Patent [19]

Channing et al.

[11] 3,806,832

[45] Apr. 23, 1974

[54] R. C. OSCILLATOR

[75] Inventors: Dean A. Channing, St. Charles; Bruce M. Esters, Woodridge, both of Ill.

[73] Assignee: GTE Automatic Electric Laboratories Incorporated, Northlake, Ill.

[22] Filed: Dec. 21, 1972

[21] Appl. No.: 317,474

[52] U.S. Cl. ................ 331/135, 331/40, 331/108 D

[51] Int. Cl. ................ H03b 5/20

[58] Field of Search ............ 331/108 C, 108 D, 111, 331/135, 136, 40

[56] References Cited

UNITED STATES PATENTS 3,539,943 11/1970 Sheahan ............................ 331/135

3,564,455 2/1971 Wedel ............................... 331/135

*Primary Examiner*—John Kominski

*Attorney, Agent, or Firm*—J. V. Lapacek

[57] ABSTRACT

An improved R.C. oscillator comprises an operational amplifier which is provided with a controlled positive feedback network such that it will oscillate at a frequency determined by a frequency dependent impedance circuit. Two such oscillators may be combined to form a two-out-of-eight frequency oscillator for a telephone touch calling unit.

9 Claims, 4 Drawing Figures

R. C. OSCILLATOR

BACKGROUND OF THE INVENTION

1. Field of the Invention

The present invention relates generally to the field of oscillator circuits and more particularly to a new and improved R.C. oscillator.

2. Description of the Prior Art

Prior to the present invention R.C. oscillators such as the Wien bridge, twin tee and phase shift types have been widely used. Each type offers relatively good frequency stability and low distortion providing the circuit components were properly selected. With these circuits, however, it was necessary to vary and match two or more components in order to retain the low distortion characteristics over a wide frequency range.

A partial solution to the above-described problem was set forth in U.S. Pat. No. 3,539,943 which issued to D. F. Sheahan on Nov. 10, 1970 and is assigned to the assignee of the present application. That reference is directed to an oscillator utilizing a gyrator circuit wherein two operational amplifiers are made to oscillate at a fixed amplitude and a frequency determined by the values of four resistors in conjunction with two capacitors forming a simulated parallel coupled RLC tank circuit. While that oscillator has been found acceptable in many applications, a shortcoming still remains in that the output of the circuit is of a fixed amplitude.

OBJECTS AND SUMMARY OF THE INVENTION

From the preceding discussion it will be understood that among the various objectives of the present invention are included:

the provision of a new and improved oscillator of the R.C. type;

the provision of an oscillator of the above-described character which has a variable output amplitude; and the provision of an oscillator of the above-described character wherein the output frequency is variable through variation of a single component value.

These and other objectives of the present invention are efficiently achieved by providing a first operational amplifier with a positive feedback control network and a series connected frequency dependent impedance circuit including a second operational amplifier. The first amplifier thus will oscillate at a frequency determined by the frequency dependent impedance. The oscillator output amplitude may be adjusted through variation of a single resistance element in the feedback control network and its frequency by variation of a single one of the resistance or capacitance elements in the frequency dependent impedance circuit.

The foregoing as well as other objects, features and advantages of the present invention will become more apparent from the following detailed description taken in conjunction with the various views of the appended drawings.

DESCRIPTION OF PREFERRED EMBODIMENT

Figure 1:
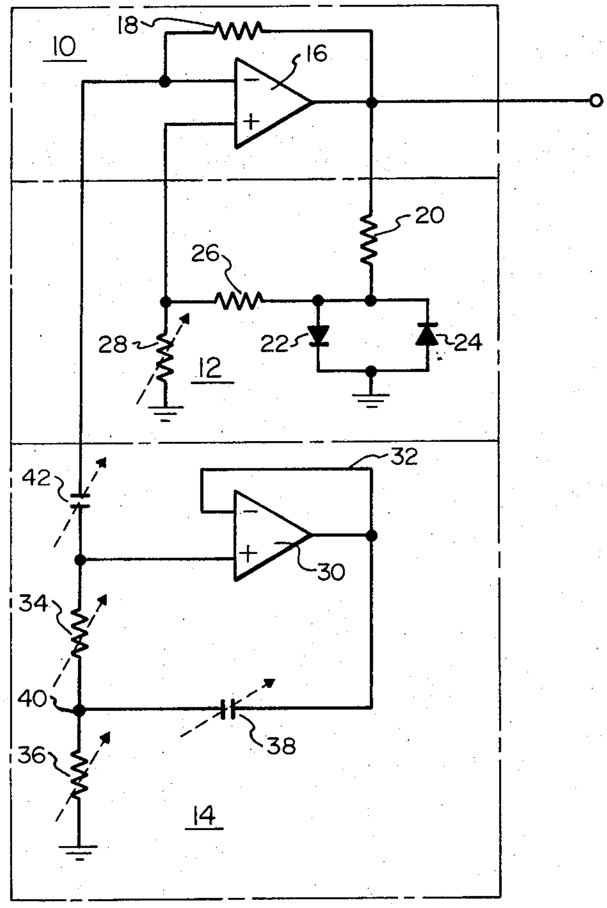
FIG. 1 is a schematic diagram of an improved R.C. type oscillator in accordance with the principles of the present invention.

Turning now to FIG. 1 there is schematically illustrated an R.C. oscillator constructed in accordance with the present invention. This oscillator may be divided into three basic functional component parts; an amplifier 10, a feedback control network 12, and a frequency dependent impedance circuit 14. The operational amplifier 16 may be of the conventional type such as a type 741 which is well known in the art and commercially available from a wide variety of suppliers. As is also conventional the operational amplifier is provided with a resistor 18 in its negative feedback loop.

The feedback control network 12 is coupled between the output of the operational amplifier 16 and the positive input thereof and operates to control the positive feedback. A first resistor 20 is connected to the output of operational amplifier 16 and through opposed, parallel connected diodes 22 and 24 to ground potential. Resistor 20 is also connected via second resistor 26 to the positive input of operational amplifier 16 and through third resistor 28 to ground potential. The feedback control network 12 will thus been seen to introduce a controlled positive feedback to provide the amplifier 10 with a net gain of slightly greater than unity at the peak of its gain characteristic. If it is desired that the output voltage of the oscillator be variable, resistor 28 may be a potentiometer as indicated by the arrow shown in phantom. In actual practice the applicants have found that the rms output voltage of the oscillator may conveniently be varied over the range from 0.6 to 10 volts in this manner providing the supply volt is greater than $\pm 10$v.

The frequency dependent impedance circuit 14 includes a second conventional type operational amplifier 30 having a negative feedback loop 32 and having its positive input connected through resistors 34 and 36 to ground potential. The output of operational amplifier 30 is coupled through capacitor 38 to the junction 40 between resistors 34 and 36, and the positive input is coupled via capacitor 42 to the negative input of operational amplifier 16. The frequency dependent impedance circuit thus simulates a series LCR resonant circuit which exhibits the impedance vs. frequency characteristic shown in the graph of FIG. 2.

Figure 3:
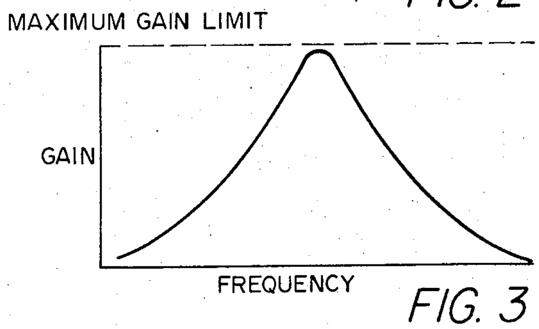
FIG. 3 is a graph of the gain vs. frequency characteristic of the operational amplifier of FIG. 1.

By coupling the frequency dependent impedance circuit 12 to the negative input of amplifier 10 the net gain of the latter is the inverse of the impedance vs. frequency characteristic of the former. This gain vs. frequency characteristic is illustrated in the graph of FIG. 3.

Figure 2:
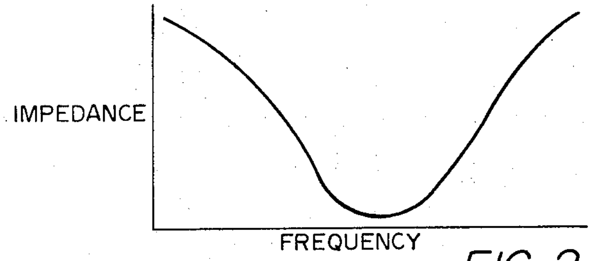
FIG. 2 is a graph of the impedance vs. frequency of the frequency dependent impedance circuit of FIG. 1.

The frequency dependent impedance circuit 12 thus operates to vary the input impedance of amplifier 10. The second operational amplifier 30 simulates an inductor in series with capacitor 42 and therefore the circuit exhibits the impedance notch at the resonant frequency as shown in FIG. 2. The input impedance of amplifier 10 being at a minimum at the resonant frequency, the maximum gain, as determined by the value of resistor 28 in the feedback control network 12 and illustrated in FIG. 3, is also at that frequency.

In some applications it may be desired to provide a variable frequency oscillator. In such cases the output frequency may easily be varied by altering the value of any one of capacitors 38 or 42 or resistors 34 or 36. This provision is schematically indicated by the phantom arrow on each of these circuit elements, however, it is to be understood that only one need be varied to alter the output frequency. In the practice of the invention it is preferred that resistor 34 be the variable component, either through the use of a potentiometer as shown in FIG. 1 or a plurality of switchable resistors.

Due to the simplicity of the oscillator of FIG. 1, it is very amenable to fabrication using hybrid thick film microcircuit technology. Through the use of this type of fabrication technique, the oscillator may be economically produced in a compact form which is adaptable for use as a multifrequency oscillator in the touch calling unit of telephone instruments. Such an embodiment of the present invention is schematically illustrated in FIG. 4.

Figure 4:
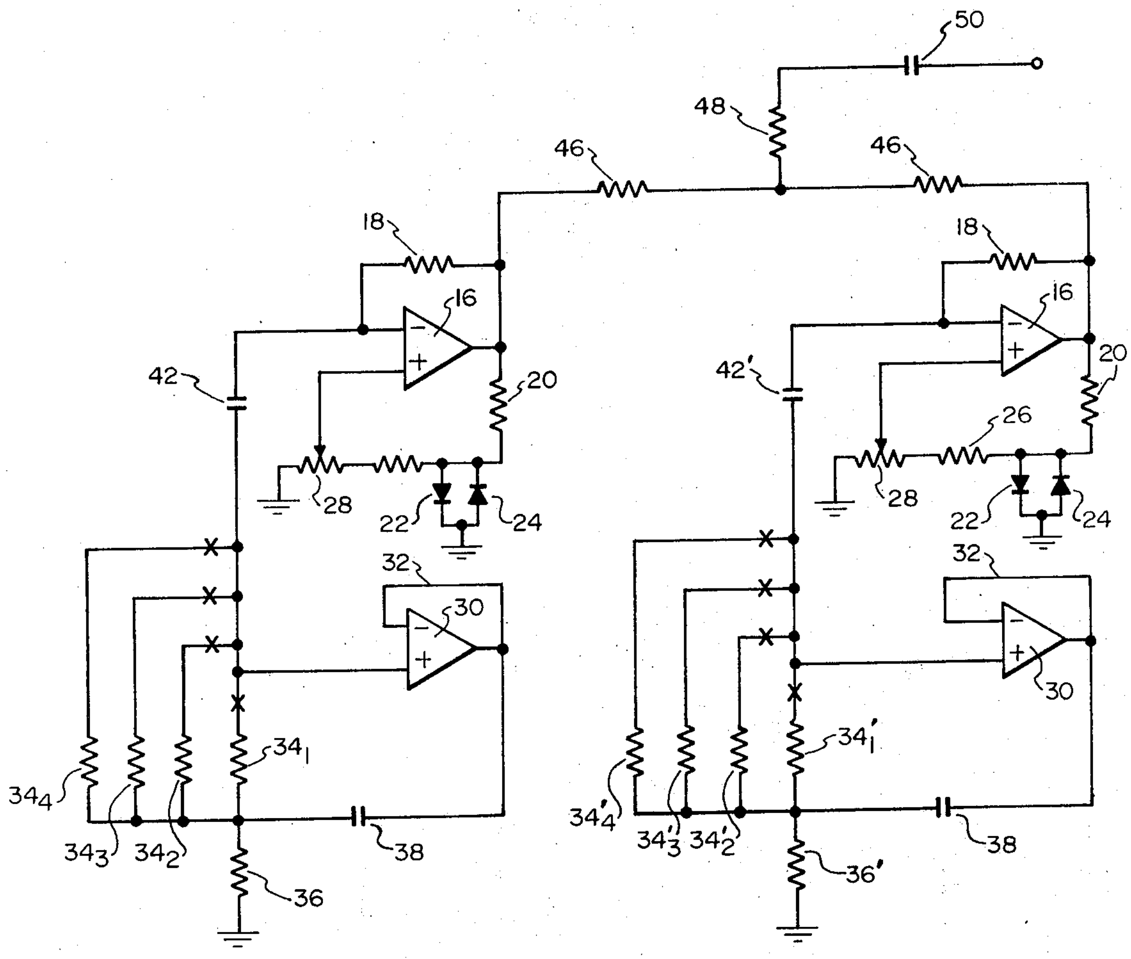
FIG. 4 is a schematic diagram of two oscillators of the type illustrated in FIG. 1 combined to form a two-out-of-eight frequency oscillator.

With reference now to FIG. 4 it will be seen that the multifrequency touch calling unit is essentially two parallel connected oscillators of the type shown in FIG. 1. Circuit elements common to FIGS. 1 and 4 are thus identified by like reference characters. Where the component values of the two oscillators differ to provide a sufficient number of discrete frequencies a "prime" notation is used to distinguish between them.

The differences between the oscillators of FIG. 4 and that of FIG. 1 are minimal and include the use of four resistors $34_1$–$34_4$ and $34_1'$–$34_4'$ each having a discrete resistance value and being selectively switchable via normally open electrical contacts $44_1$–$44_8$. These contacts may be the pushbutton switches of a touch calling type telephone instrument.

Since the oscillator outputs are coupled in parallel through individual reistors 46 and common output resistor 48, any two selected output frequencies will combine at the output capacitor 50 of the touch calling unit to produce combination signals which may be uniquely correlated with a corresponding one of the twelve digits present on the conventional touch calling keyboard of a telephone instrument.

It will be understood that the foregoing component values, frequencies and keyboard associations are given for the purposes of illustration only and are not to be construed as limiting the application of the invention.

From the preceding description it will be seen that the applicants have provided a new and novel R.C. type oscillator whereby the objectives set forth hereinabove are efficiently achieved. Since certain changes will occur to those skilled in the art without departure from the scope of the invention it is intended that all matter set forth in the foregoing description or shown in the appended drawings shall be interpreted as illustrative and not in a limiting sense.

Having described what is new and novel and desired to secure by Letters Patent, what is claimed is:

1. An improved R.C. type oscillator circuit comprising a first operational amplifier having an output terminal, a positive input terminal, and a negative input terminal, a feedback control network coupled between the output terminal and the positive input terminal of said first operational amplifier for providing said first operational amplifier with a net gain greater than one, a frequency dependent impedance circuit coupled in series to the negative input terminal of said first operational amplifier and including a second operational amplifier having an output terminal, a positive input terminal and a negative input terminal, the output terminal of said second operational amplifier being coupled to the negative input terminal of said first operational amplifier, said frequency dependent impedance circuit having a selected impedance vs. frequency characteristic and operating to control the input impedance of said first operational amplifier such that the gain vs. frequency characteristic of said first operational amplifier is substantially the inverse of the impedance vs. frequency characteristic of said frequency dependent impedance circuit.

2. The circuit recited in claim 1 wherein said feedback control network comprises a first resistance connected to the output of said first operational amplifier, first and second opposed parallel diodes connected between said first resistance and ground potential, a second resistance connected between said first resistance and the positive input terminal of said first operational amplifier, and a third resistance connected between said second resistance and ground potential.

3. The circuit recited in claim 2 wherein said third resistance is a variable resistance, the varying of which operates to vary the feedback from the output terminal to the positive input terminal of said first operational amplifier and thereby vary the output voltage thereof.

4. The circuit recited in claim 1 wherein said frequency dependent impedance circuit comprises said second operational amplifier, feedback means connected between the output terminal and the negative input terminal of said second operational amplifier, first and second resistances connected in series between the positive input terminal of said second operational amplifier and ground potential, a first capacitance connected between the output terminal of said second operational amplifier and a point intermediate said first and second resistances, a second capacitance connected between the positive input terminal of said second operational amplifier and the negative input terminal of said first operational amplifier, and said frequency dependent impedance circuit having a minimum impedance at a selected frequency.

5. The circuit recited in claim 4 wherein said first resistance is a variable resistance the varying of which operates to vary the frequency at which said frequency dependent impedance circuit has said minimum impedance.

6. The circuit recited in claim 4 wherein said second resistance is a variable resistance the varying of which operates to vary the frequency at which said frequency dependent impedance circuit has said minimum impedance.

7. The circuit recited in claim 4 wherein said first capacitance is a variable capacitance the varying of which operates to vary the frequency at which said frequency dependent impedance circuit has said minimum impedance.

8. The circuit recited in claim 4 wherein said second capacitance is a variable capacitance the varying of which operates to vary the frequency at which said frequency dependent impedance circuit has said minimum impedance.

9. The circuit recited in claim 5 wherein said first variable resistance comprises a plurality of parallel resistances each having a unique value, and further including exclusive switching means for selectively connecting one of said plurality of resistances to the positive input terminal of said second operational amplifier, whereby the frequency at which said frequency dependent impedance circuit has said minimum impedance is selectively switched to one of a plurality of unique frequencies.

* * * * *

UNITED STATES PATENT OFFICE
CERTIFICATE OF CORRECTION

Patent No. 3,806,832 Dated Apr. 23, 1974

Inventor(s) DEAN A. CHANNING and BRUCE M. ESTES

It is certified that error appears in the above-identified patent and that said Letters Patent are hereby corrected as shown below:

In the cover page [75] Inventors: DEAN A. CHANNING
BRUCE M. ESTERS should be

Inventors: DEAN A. CHANNING
BRUCE M. ESTES

Signed and sealed this 1st day of October 1974.

(SEAL)
Attest:

McCOY M. GIBSON JR.
Attesting Officer

C. MARSHALL DANN
Commissioner of Patents